United States Patent
Chang et al.

(10) Patent No.: US 8,203,576 B2
(45) Date of Patent: Jun. 19, 2012

(54) METHOD FOR ALIGNING OBJECTS

(75) Inventors: Chih-Kuang Chang, Taipei Hsien (TW); Xin-Yuan Wu, Shenzhen (CN); Shao-Qin Xie, Shenzhen (CN); Min Wang, Shenzhen (CN); Hua Huang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 790 days.

(21) Appl. No.: 12/338,963

(22) Filed: Dec. 18, 2008

(65) Prior Publication Data

US 2010/0061622 A1    Mar. 11, 2010

(30) Foreign Application Priority Data

Sep. 8, 2008   (CN) .......................... 2008 1 0304414

(51) Int. Cl.
*G06K 9/32* (2006.01)
(52) U.S. Cl. ........ 345/644; 345/427; 345/619; 345/629; 345/630; 345/643; 382/154; 382/190
(58) Field of Classification Search .................. 345/419, 345/420, 424, 427, 619, 629, 630, 643, 644; 382/154, 190
See application file for complete search history.

(56) References Cited

U.S. PATENT DOCUMENTS

| | | | | |
|---|---|---|---|---|
| 5,531,520 | A | * | 7/1996 | Grimson et al. .............. 382/131 |
| 6,178,392 | B1 | * | 1/2001 | Mack et al. ...................... 703/7 |
| 6,505,148 | B1 | * | 1/2003 | Mack et al. ...................... 703/7 |
| 6,556,705 | B1 | * | 4/2003 | Shalom ........................ 382/154 |
| 7,414,596 | B2 | * | 8/2008 | Satoh et al. ...................... 345/8 |
| 7,869,664 | B2 | * | 1/2011 | Lu et al. ........................ 382/294 |
| 7,990,398 | B2 | * | 8/2011 | Pelletier et al. .............. 345/648 |
| 2003/0085890 | A1 | * | 5/2003 | Baumberg et al. ............ 345/420 |
| 2004/0004623 | A1 | * | 1/2004 | Miller ........................... 345/592 |
| 2008/0012851 | A1 | * | 1/2008 | Bae et al. ...................... 345/419 |
| 2009/0102837 | A1 | * | 4/2009 | Kang et al. ................... 345/419 |

* cited by examiner

*Primary Examiner* — Xiao M. Wu
*Assistant Examiner* — Todd Buttram
(74) *Attorney, Agent, or Firm* — Altis Law Group, Inc.

(57) ABSTRACT

A computer implemented method for aligning objects receives a reference object and a to-be-moved object; determining feature elements of the reference object. A first coordinate system is constructed according to a plurality of feature elements of the reference object. A second coordinate system is constructed according to a plurality of feature elements of the to-be-moved object. A third coordinate system is constructed according to the first coordinate system and the second coordinate system. An operation matrix is computed according to the three coordinate systems. The two objects are aligned using the operation matrix.

18 Claims, 8 Drawing Sheets

METHOD FOR ALIGNING OBJECTS

BACKGROUND

1. Technical Field

Embodiments of the present disclosure generally relate to methods for image measurement, and more particularly, to a method for aligning objects.

2. Description of Related Art

In image measuring technology, aligning two objects is often a difficult task. The objects can be point clouds or three-dimensional graphics. One such system for aligning objects is the Geomagic Qualify software.

However, even though the Geomagic Qualify software can align objects, it consists of many calculations. As a result, convenience and flexibility are undoubtedly decreased and it is difficult, complex, and time-consuming for Geomagic Qualify to offer a robust solution to the above problem.

What is needed, therefore, is a method which can align objects, for reducing complexity of calculations and enhancing work efficiency.

DETAILED DESCRIPTION OF CERTAIN INVENTIVE EMBODIMENTS

All of the processes described below may be embodied in, and fully automated via, software code modules executed by one or more general purpose computers or processors. The code modules may be stored in any type of computer-readable medium or other computer storage device. Some or all of the methods may alternatively be embodied in specialized computer hardware.

Figure 1:
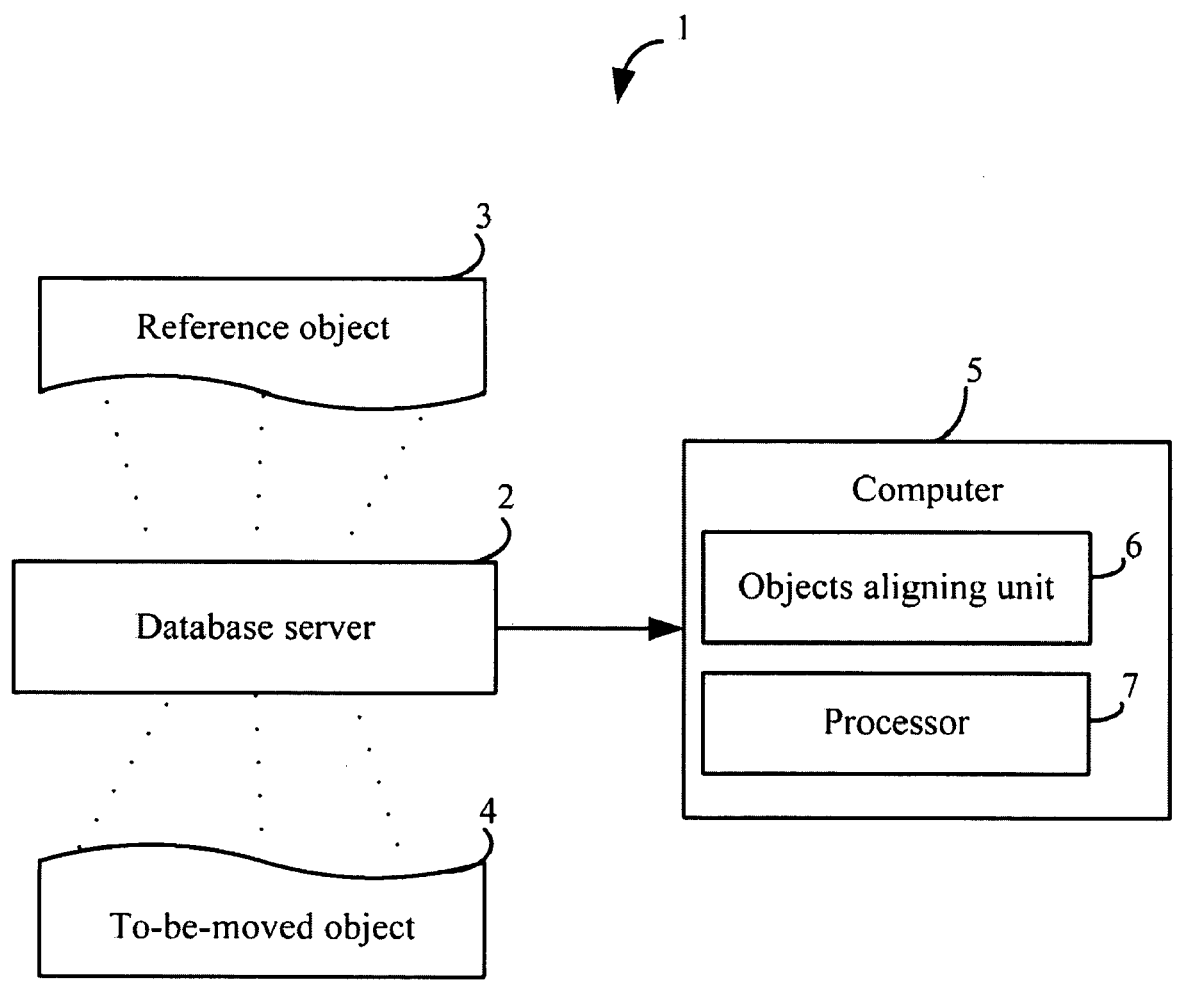
FIG. 1 is a block diagram of one embodiment of a system for aligning objects.

FIG. 1 is a block diagram of one embodiment of a system 1 for aligning objects. The system 1 can inspect a finished part for deviations from its as-designed CAD model by aligning a captured image of the finished part with the designed CAD model.

In one embodiment, the system 1 may include a database server 2 that stores a plurality of objects, such as a reference object 3 and a to-be-moved object 4. It may be understood that, the objects may be point clouds or three-dimensional graphics. In one embodiment, the reference object 3 may be a designed CAD model, and the to-be-moved object 4 may be a point cloud of a captured image of a finished part based on the CAD model. The system 1 may further include a computer 5 for executing a method for aligning the objects which come from the database server 2 using an objects aligning unit 6.

The computer 5 further includes a processor 7 for executing one or more computerized functions for the objects aligning unit 6.

Figure 2:
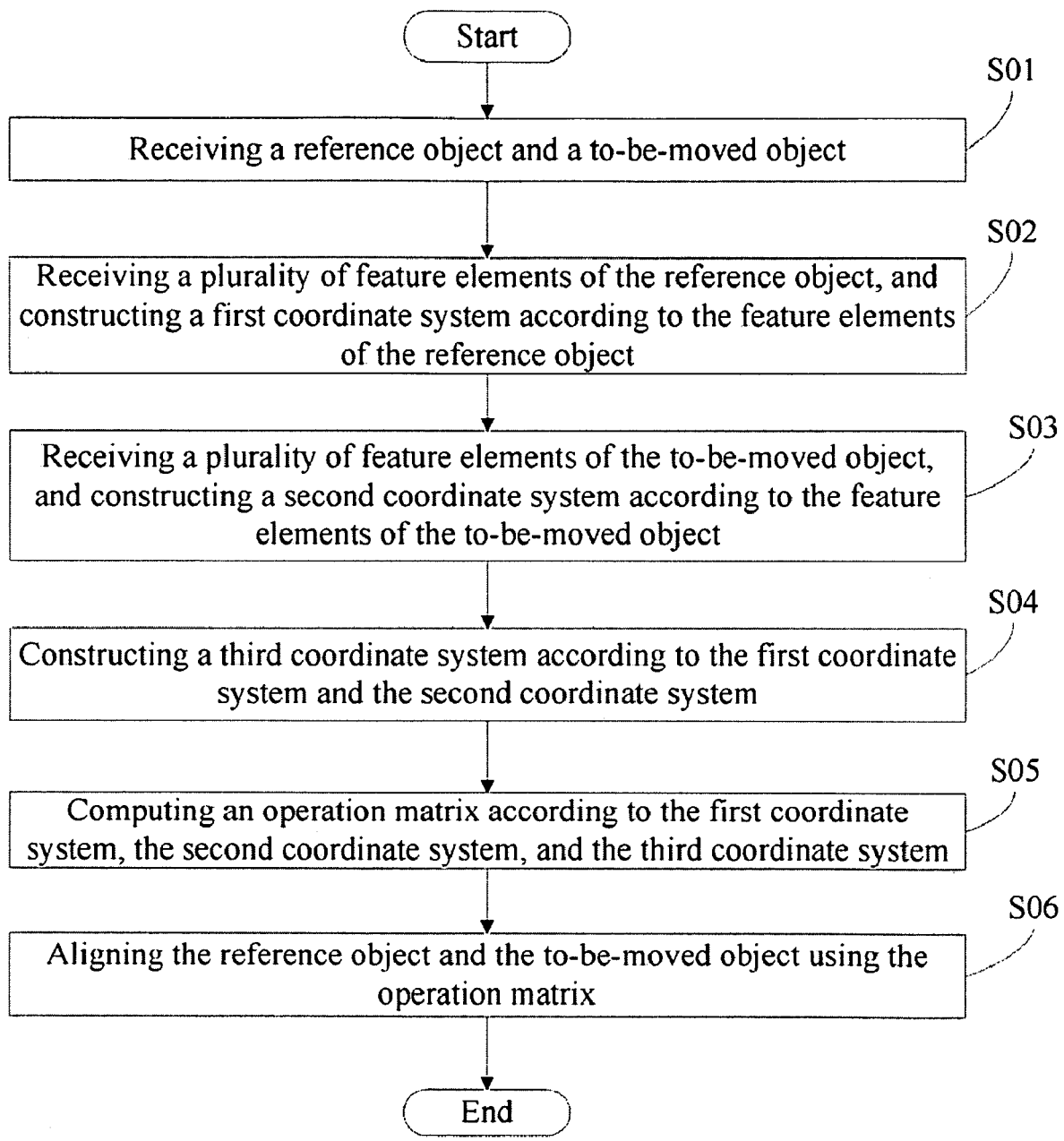
FIG. 2 is a flowchart illustrating one embodiment of a method for aligning objects.

FIG. 2 is a flowchart illustrating one embodiment of a method for aligning objects. Depending on the embodiment, additional blocks in the flow of FIG. 2 may be added, others removed, and the ordering of the blocks may be changed.

In block S01, the objects aligning unit 6 receives at least two objects from the database server 2. In one embodiment, the two objects are the reference object 3 and the to-be-moved object 4.

In block S02, the objects aligning unit 6 receives a plurality of feature elements of the reference object 3, and constructs a first coordinate system according to the feature elements of the reference object 3. It may be understood that, the feature elements may be selected by a user according to a predetermined criteria. In one embodiment, each of the feature elements is selected from a group consisting of a line, a plane, a circle, and a sphere. A method for constructing a first coordinate system as in block S02 will be described below referencing FIG. 3.

In block S03, the objects aligning unit 6 receives a plurality of feature elements of the to-be-moved object 4, and constructs a second coordinate system according to the feature elements of the to-be-moved object 4. In one embodiment, each of the feature elements is selected from a group consisting of a line, a plane, a circle, and a sphere. A method for constructing a second coordinate system as in block S03 will be described below also referencing FIG. 3.

Figure 8:
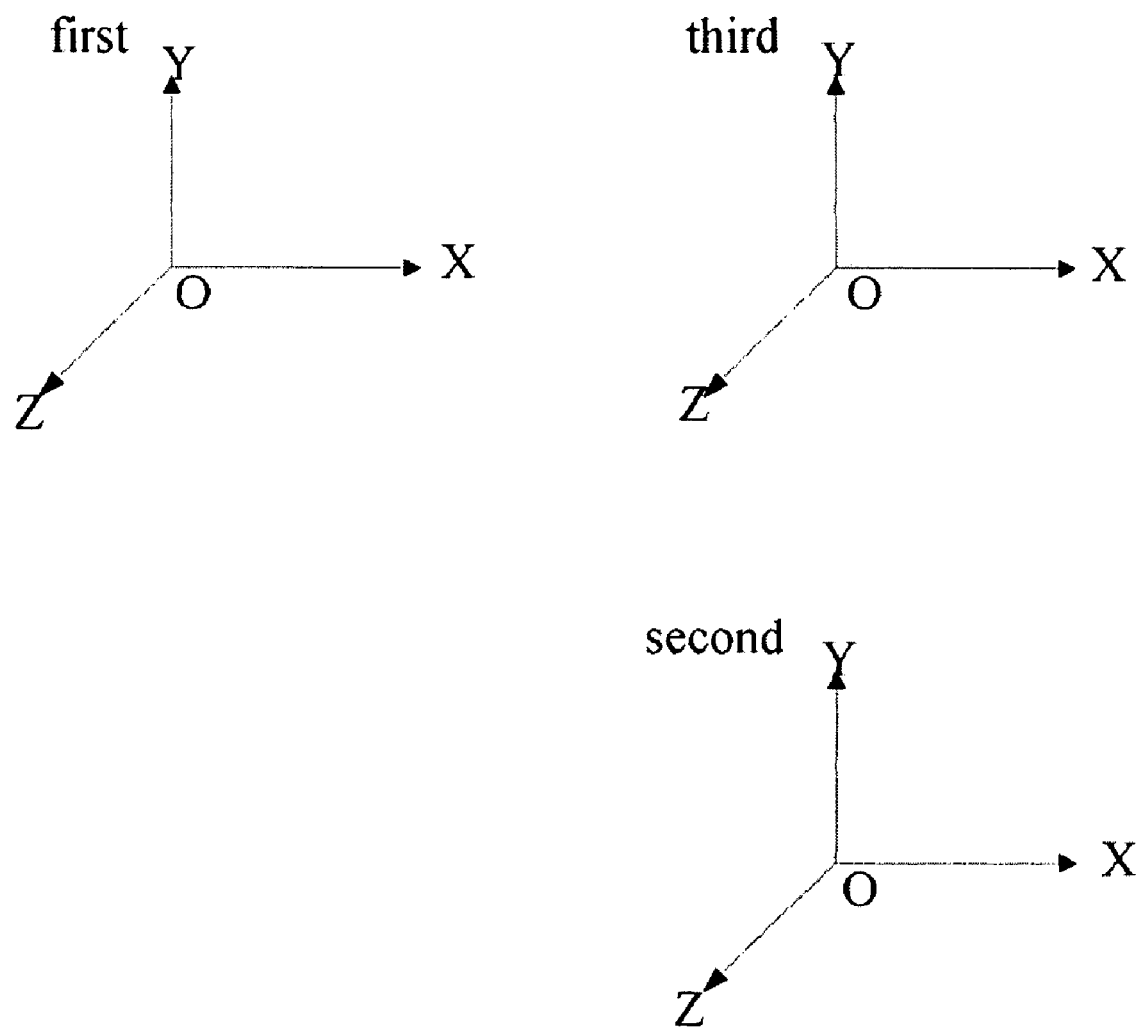
FIG. 8 is schematic diagram illustrating three coordinate systems described in block S04 of FIG. 2.

In block S04, the objects aligning unit 6 constructs a third coordinate system according to the first coordinate system and the second coordinate system. In one embodiment, the objects aligning unit 6 firstly determines an origin of the third coordinate system by obtaining an intersection point of the X axis of the first coordinate system and the Y axis of the second coordinate system. Then, the objects aligning unit 6 determines the X axis of the third coordinate system by obtaining a normal vector of the X axis of the first coordinate system. After that, the objects aligning unit 6 determines the Y axis of the third coordinate system by obtaining a normal vector of the Y axis of the second coordinate system. Finally, the objects aligning unit 6 constructs the third coordinate system. An example of the three coordinate systems is shown in FIG. 8.

In block S05, the objects aligning unit 6 obtains an operation matrix according to the first coordinate system, the second coordinate system, and the third coordinate system. A method for obtaining the operation matrix of block S05 will be described in detail below referencing FIG. 7.

In block S06, the objects aligning unit 6 moves each point of the to-be-measured object 4 through multiplying coordinate value of each point of the to-be-moved object 4 by the operation matrix, so as to align the reference object 3 and the to-be-moved object 4. Specifically, the objects aligning unit 6 computes a first coordinate value of each point of the to-be-moved object 4 using the third coordinate system, obtains a second coordinate value of the each point of the to-be-moved object 4 through multiplying the first coordinate value by the operation matrix, and transfers the each point of the to-be-moved object 4 to where the second coordinate value is to align the reference object 3 and the to-be-moved object 4.

Figure 3:
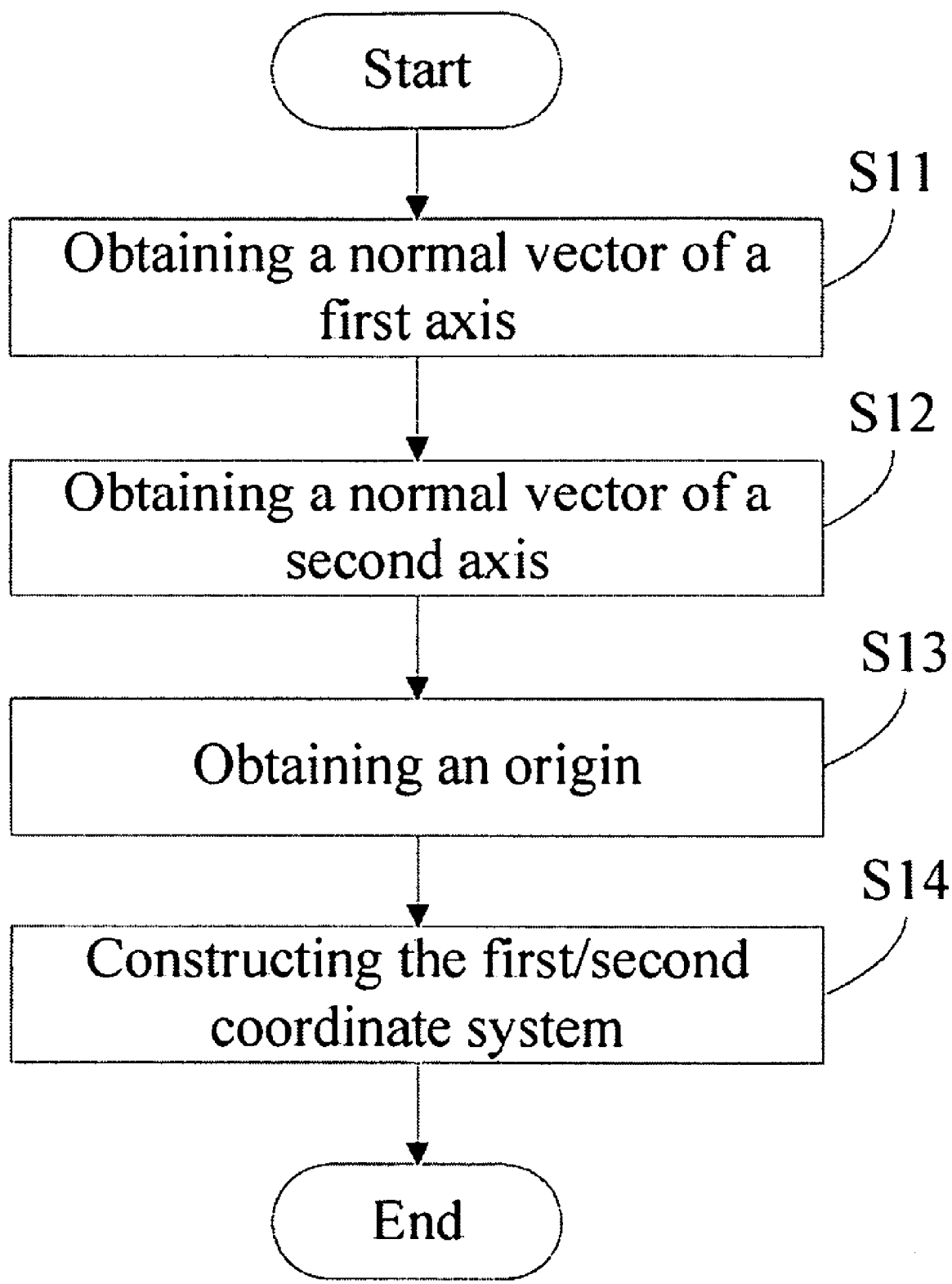
FIG. 3 is a flowchart illustrating one embodiment of a method detailing block S02/block S03 of FIG. 2.

FIG. 3 is a flowchart illustrating one embodiment of a method detailing blocks S02, S03 of FIG. 2. Depending on the embodiment, additional blocks in the flow of FIG. 3 may be added, others removed, and the ordering of the blocks may be changed.

It may be understood that, the methods of constructing the first coordinate system and constructing the second coordinate system are same, so the flows described below take constructing the first coordinate system as an example.

In block S11, the objects aligning unit 6 obtains a normal vector of a first axis of the first coordinate system. In one embodiment, the first axis is a Z axis. A method for obtaining a normal vector of a first axis of the first coordinate system will be described below referencing FIG. 4.

In block S12, the objects aligning unit 6 obtains a normal vector of a second axis of the first coordinate system. In one embodiment, the second axis is an X axis. A method for obtaining a normal vector of a second axis of the first coordinate system will be described below referencing FIG. 5.

In block S13, the objects aligning unit 6 obtains an origin of the first coordinate system. A method for obtaining an origin of the first coordinate system will be described below referencing FIG. 6.

In block S14, the objects aligning unit 6 constructs the first coordinate system using the normal vector of the first axis, the normal vector of the second axis, and the origin.

Figure 4:
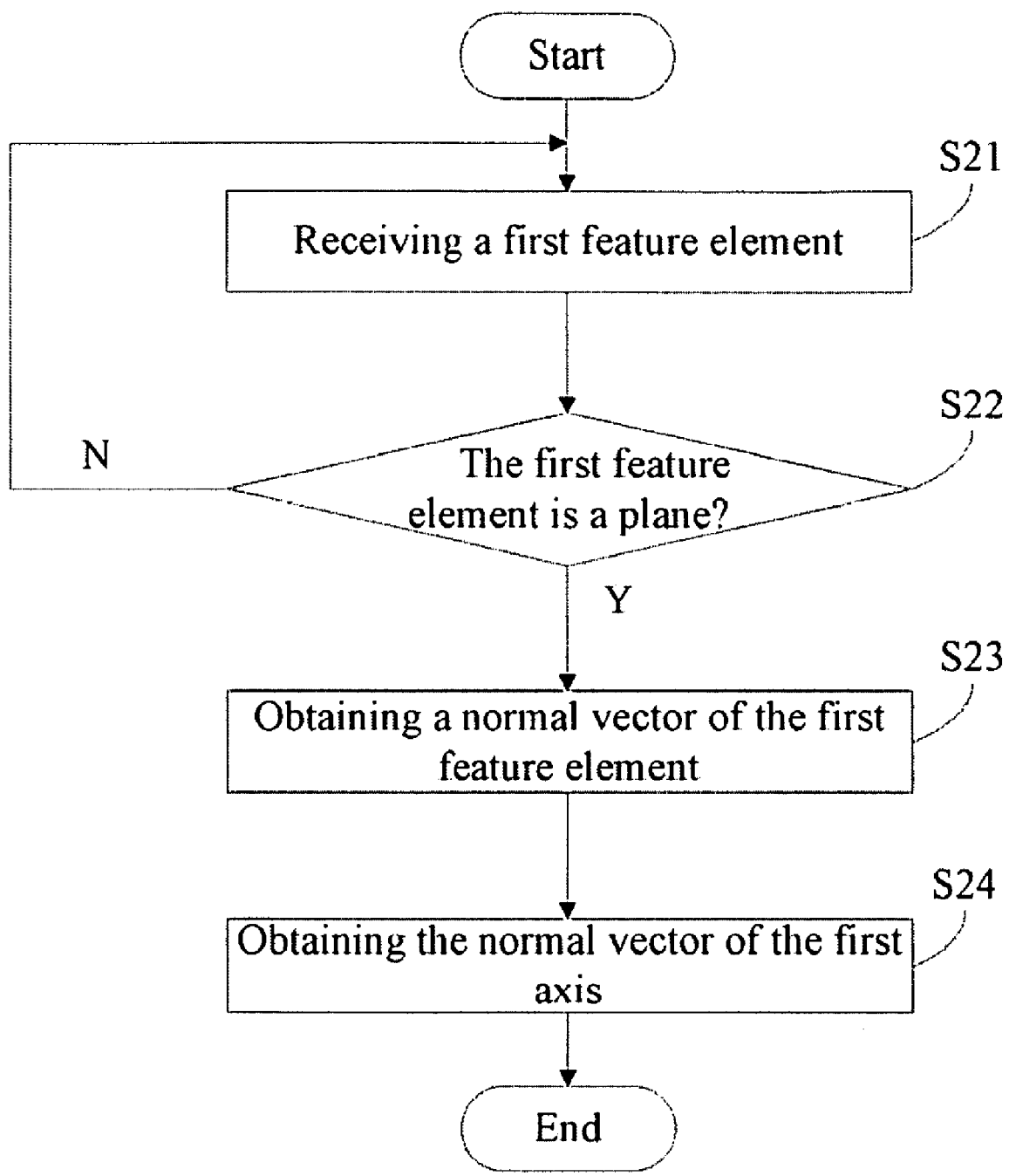
FIG. 4 is a flowchart illustrating one embodiment of a method detailing block S11 of FIG. 3.

FIG. 4 is a flowchart illustrating one embodiment of a method for obtaining a normal vector of a first axis of the first coordinate system of block S11 of FIG. 3. Depending on the embodiment, additional blocks in the flow of FIG. 4 may be added, others removed, and the ordering of the blocks may be changed.

In block S21, the objects aligning unit 6 receives a first feature element of the reference object 3.

In block S22, the objects aligning unit 6 determines if the first feature element is a plane. The flow repeats block S21 if the first feature element is not a plane. Otherwise, the flow moves to block S23.

In block S23, the objects aligning unit 6 obtains a normal vector of the first feature element.

In block S24, the objects aligning unit 6 obtains the normal vector of the first axis of the first coordinate system. It may be understood that, the normal vector of the first feature element is the normal vector of the first axis of the first coordinate system.

Figure 5:
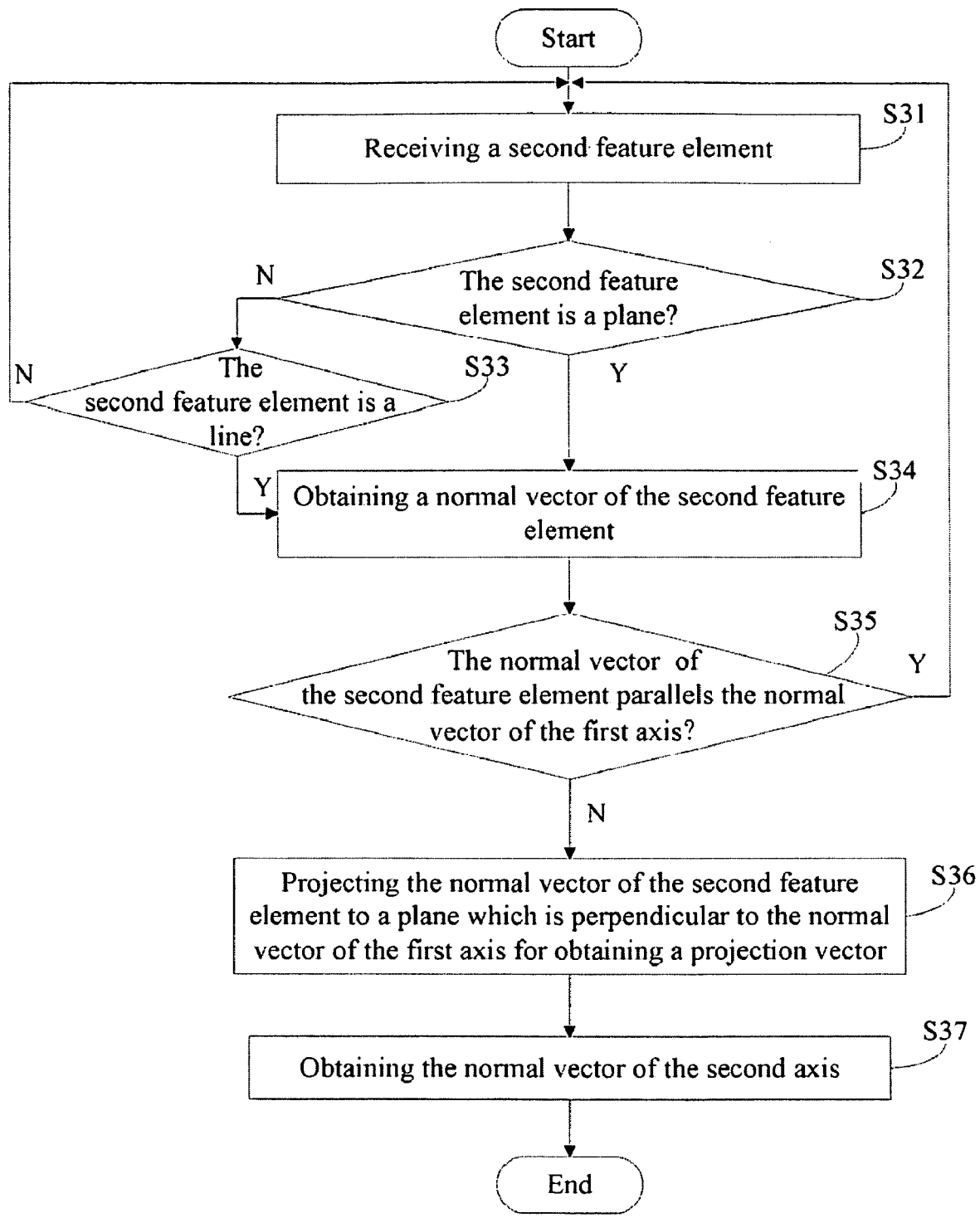
FIG. 5 is a flowchart illustrating one embodiment of a method detailing block S12 of FIG. 3.

FIG. 5 is a flowchart illustrating one embodiment of a method for obtaining a normal vector of a second axis of the first coordinate system of block S12 of FIG. 3. Depending on the embodiment, additional blocks in the flow of FIG. 5 may be added, others removed, and the ordering of the blocks may be changed.

In block S31, the objects aligning unit 6 receives a second feature element of the reference object 3.

In block S32, the objects aligning unit 6 determines if the second feature element is a plane. The flow goes directly to block S34 if the second feature is a plane. Otherwise, the flow moves to block S33 if the second feature element is not a plane.

In block S33, the objects aligning unit 6 determines if the second feature element is a line. The flow returns to block S31 if the second feature element is not a line. Otherwise, the flow goes to block S34 if the second feature element is a line.

In block S34, the objects aligning unit 6 obtains a normal vector of the second feature element.

In block S35, the objects aligning unit 6 determines if the normal vector of the second feature element is parallel to the normal vector of the first axis of the first coordinate system. The flow returns to block S31 if the normal vector of the second feature element is parallel to the normal vector of the first axis of the first coordinate system. Otherwise, the flow moves to block S36.

In block S36, the objects aligning unit 6 projects the normal vector of the second feature element to a plane which is perpendicular to the normal vector of the first axis of the first coordinate system for obtaining a projection normal vector.

In block S37, the objects aligning unit 6 obtains the normal vector of the second axis of the first coordinate system. It may be understood that, the projection normal vector is the normal vector of the second axis of the first coordinate system.

Figure 6:
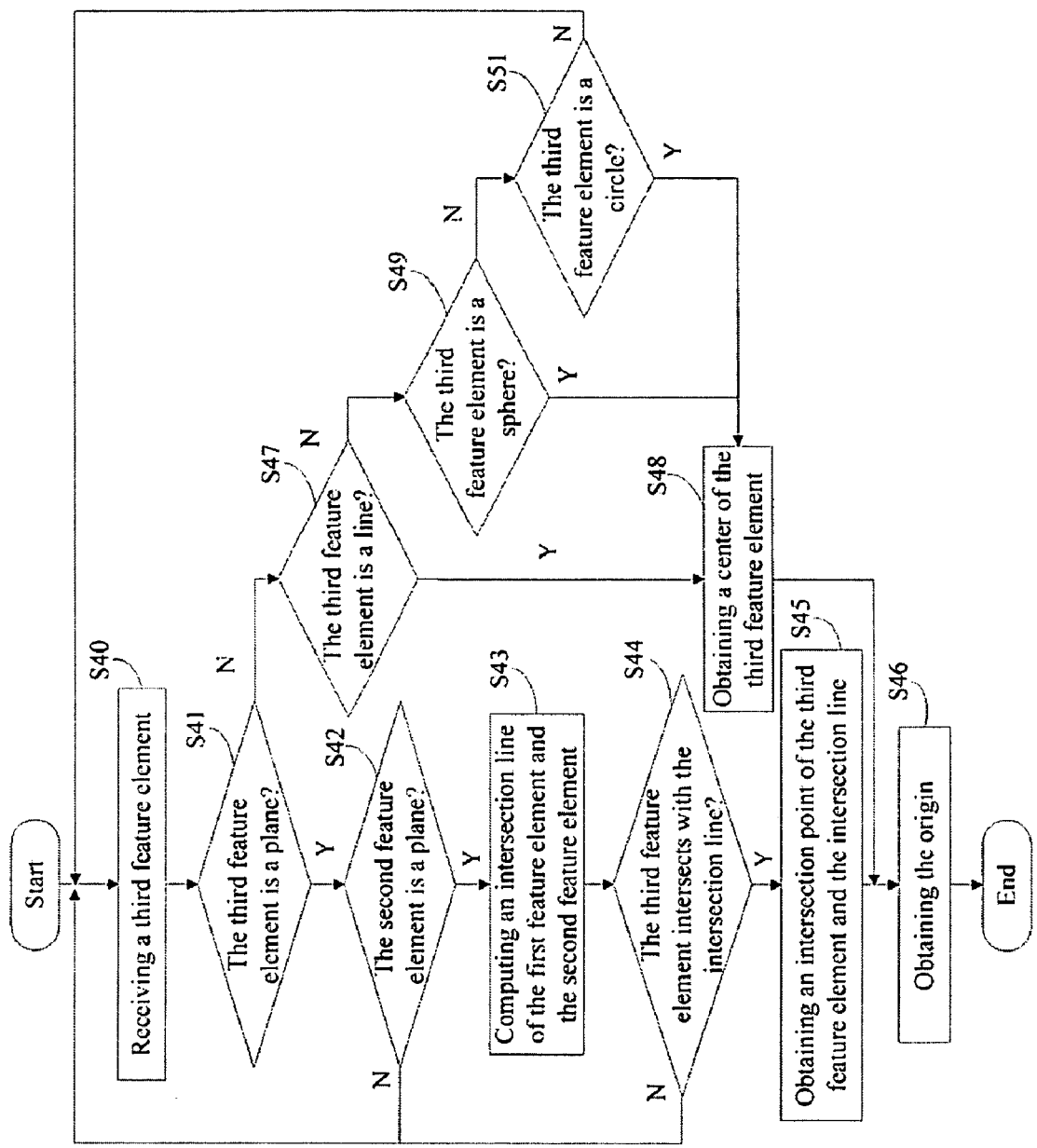
FIG. 6 is a flowchart illustrating one embodiment of a method detailing block S13 of FIG. 3.

FIG. 6 is a flowchart illustrating one embodiment of a method for obtaining an origin of the first coordinate system of block S13 of FIG. 3. Depending on the embodiment, additional blocks in the flow of FIG. 6 may be added, others removed, and the ordering of the blocks may be changed.

In block S40, the objects aligning unit 6 receives a third feature element of the reference object 3.

In block S41, the objects aligning unit 6 determines if the third feature element is a plane. The flow moves to block S47 if the third feature element is not a plane. Otherwise, the flow goes to block S42 if the third feature element is a plane.

In block S42, the objects aligning unit 6 determines if the second feature element recited in FIG. 5 is a plane. The flow returns to block S40 if the second feature element is not a plane. Otherwise, the flow moves to block S43 if the second feature element is a plane.

In block S43, the objects aligning unit 6 computes an intersection line of the first feature element recited in FIG. 4 and the second feature element.

In block S44, the objects aligning unit 6 determines if the third feature element intersects with the intersection line. The flow returns to block S40 if the third feature element does not intersect with the intersection line. Otherwise, the flow goes to block S45 if the third feature element intersects with the intersection line.

In block S45, the objects aligning unit 6 obtains an intersection point of the third feature element and the intersection line.

In block S46, the objects aligning unit 6 obtains the origin of the first coordinate system. In this embodiment, the origin of the first coordinate system is the intersection point.

In block S47, the objects aligning unit 6 determines if the third feature element is a line. The flow moves to block S49 if the third feature is not a line. Otherwise, the flow goes to block S48.

In block S48, the objects aligning unit 6 obtains a center of the third feature element, namely a center of the line, then, in block S46, the objects aligning unit 6 obtains the origin of the first coordinate system. In this embodiment, the origin of the first coordinate system is the center of the line.

In block S49, the objects aligning unit 6 determines if the third feature element is a sphere. If the third feature element is not a sphere, the flow moves to block S51. Otherwise, the flow goes to block S48 if the third feature element is a sphere.

In block S48, the objects aligning unit 6 obtains a center of the third feature element, namely a center of the sphere, then, the flow turns to block 46, the objects aligning unit 6 obtains the origin of the first coordinate system. In this embodiment, the origin of the first coordinate system is the center of the sphere.

In block S51, the objects aligning unit 6 determines if the third feature element is a circle. If the third feature element is not a circle, the flow returns to block S40. Otherwise, the flow goes to block S48 if the third feature element is a circle.

In block S48, the objects aligning unit 6 obtains a center of the third feature element, namely a center of the circle, then, the flow turns to block 46, the objects aligning unit 6 obtains the origin of the first coordinate system. In this embodiment, the origin of the first coordinate system is the center of the circle.

Figure 7:
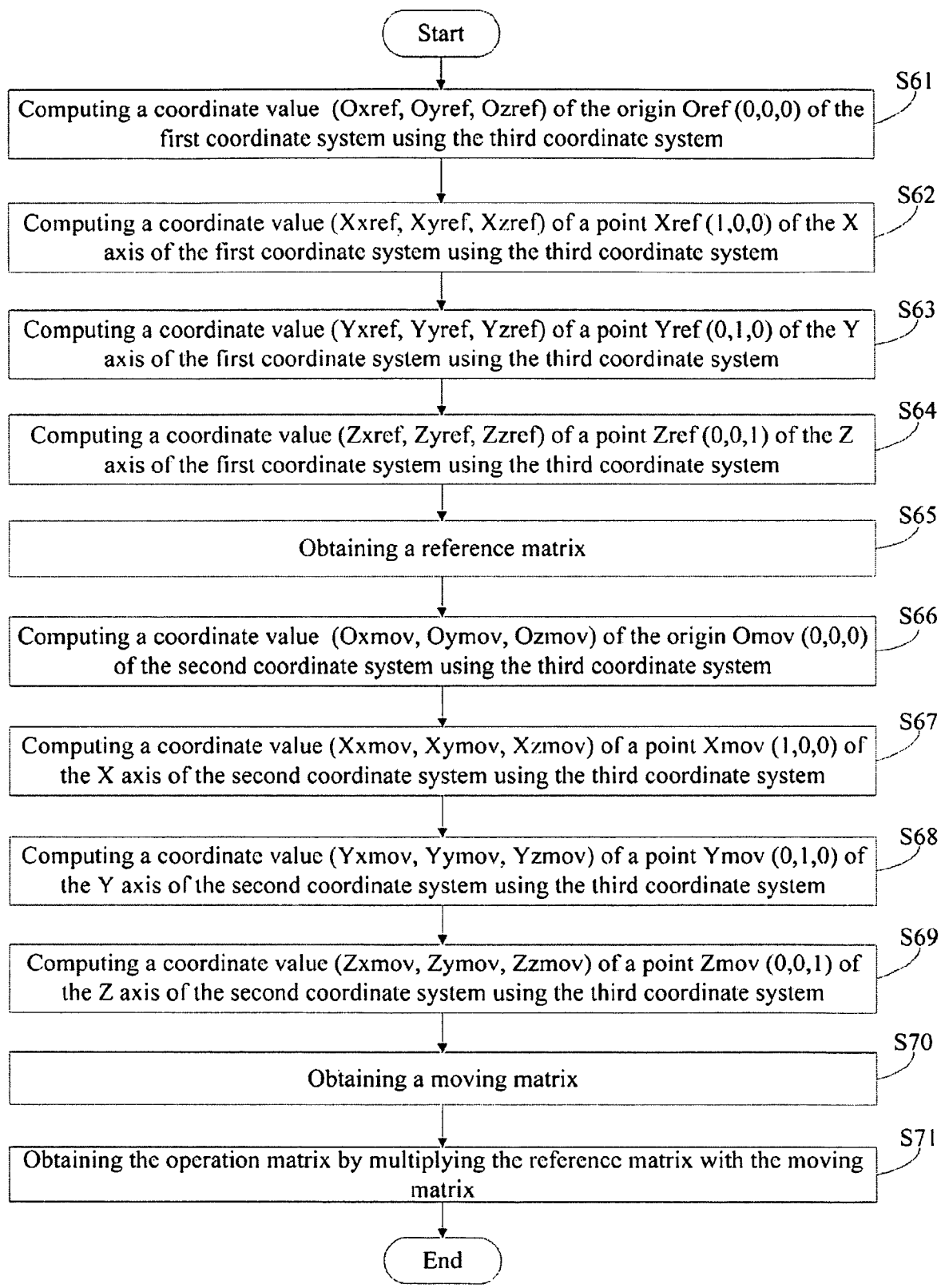
FIG. 7 is a flowchart illustrating one embodiment of a method detailing block S05 of FIG. 2.

FIG. 7 is a flowchart illustrating one embodiment of a method of obtaining the operation matrix of block S05 of FIG. 2. Depending on the embodiment, additional blocks in the flow of FIG. 7 may be added, others removed, and the ordering of the blocks may be changed.

In block S61, the objects aligning unit 6 computes a coordinate value (Oxref, Oyref, Ozref) of the origin Oref (0,0,0) of the first coordinate system using the third coordinate system.

In block S62, the objects aligning unit 6 computes a coordinate value (Xxref, Xyref, Xzref) of a point Xref (1,0,0) of the X axis of the first coordinate system using the third coordinate system.

In block S63, the objects aligning unit 6 computes a coordinate value (Yxref, Yyref, Yzref) of a point Yref (0,1,0) of the Y axis of the first coordinate system using the third coordinate system.

In block S64, the objects aligning unit 6 computes a coordinate value (Zxref, Zyref, Zzref) of a point Zref (0,0,1) of the Z axis of the first coordinate system using the third coordinate system.

In block S65, the objects aligning unit 6 obtains a referenced matrix using the coordinate value (Oxref, Oyref, Ozref), the coordinate value (Xxref, Xyref, Xzref), the coordinate value (Yxref, Yyref, Yzref), and the coordinate value (Zxref, Zyref, Zzref). Namely:

$$MatRef = \begin{Bmatrix} Oxref & Xxref & Yxref & Zxref \\ Oyref & Xyref & Yyref & Zyref \\ Ozref & Xzref & Yzref & Zzref \\ 1 & 1 & 1 & 1 \end{Bmatrix}\circ$$

In block S66, the objects aligning unit 6 computes a coordinate value (Oxmov, Oymov, Ozmov) of the origin Omov (0,0,0) of the second coordinate system using the third coordinate system.

In block S67, the objects aligning unit 6 computes a coordinate value (Xxmov, Xymov, Xzmov) of a point Xmov (1,0,0) of the X axis of the second coordinate system using the third coordinate system.

In block S68, the objects aligning unit 6 computes a coordinate value (Yxmov, Yymov, Yzmov) of a point Ymov (0,1,0) of the Y axis of the second coordinate system using the third coordinate system.

In block S69, the objects aligning unit 6 computes a coordinate value (Zxmov, Zymov, Zzmov) of a point Zmov (0,0,1) of the Z axis of the second coordinate system using the third coordinate system.

In block S70, the objects aligning unit 6 obtains a moving matrix using the coordinate value (Oxmov, Oymov, Ozmov), the coordinate value (Xxmov, Xymov, Xzmov), the coordinate value (Yxmov, Yymov, Yzmov), and the coordinate value (Zxmov, Zymov, Zzmov). Namely:

$$MatMov = \begin{Bmatrix} Oxmov & Xxmov & Yxmov & Zxmov \\ Oymov & Xymov & Yymov & Zymov \\ Ozmov & Xzmov & Yzmov & Zzmov \\ 1 & 1 & 1 & 1 \end{Bmatrix}\circ$$

In block S71, the objects aligning unit 6 obtains the operation matrix by multiplying the reference matrix with the moving matrix. Using the operation matrix, the to-be-moved object 4 can be aligned with the reference object 3. Because only a calculation is made when obtaining the operation matrix, complexity of calculations is reduced. So work efficiency is enhanced.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. A computer implemented method for aligning objects, the method comprising:
   (a) receiving two objects from a database comprising a reference object and a to-be-moved object;
   (b) receiving a plurality of feature elements of the reference object, and constructing a first coordinate system by determining a first axis, a second axis, and an origin of the first coordinate system according to the feature elements of the reference object;
   (c) receiving a plurality of feature elements of the to-be-moved object, and constructing a second coordinate system by determining a first axis, a second axis, and an origin of the second coordinate system according to the feature elements of the to-be-moved object;
   (d) constructing a third coordinate system by determining an origin of the third coordinate system by obtaining an intersection point of the X axis of the first coordinate system and the Y axis of the second coordinate system;
   determining an X axis of the third coordinate system by obtaining a normal vector of the X axis of the first coordinate system;
   determining a Y axis of the third coordinate system by obtaining a normal vector of the Y axis of the second coordinate system; and
   constructing the third coordinate system;
   (e) obtaining an operation matrix according to coordinate values of points on origin and axes of the first coordinate system and the second coordinate system, wherein the coordinate values are computed using the third coordinate system; and
   (f) moving each point of the to-be-measured object through multiplying coordinate values of each point of the to-be-moved object by the operation matrix, so as to align the reference object and the to-be-moved object.

2. The method as described in claim 1, wherein each of the two objects is a point cloud or a three-dimension graphic.

3. The method as described in claim 1, wherein each of the feature elements is selected from a group consisting of a line, a plane, a circle, and a sphere.

4. The method as described in claim 1, wherein block (b) comprises:
   (b1) obtaining a normal vector of a first axis of the first coordinate system;
   (b2) obtaining a normal vector of a second axis of the first coordinate system;
   (b3) obtaining an origin of the first coordinate system; and
   (b4) constructing the first coordinate system using the normal vector of the first axis, the normal vector of the second axis, and the origin.

5. The method as described in claim 1, wherein block (c) comprises:
   (i1) obtaining a normal vector of a first axis of the second coordinate system;
   (i2) obtaining a normal vector of a second axis of the second coordinate system;

(i3) obtaining an origin of the second coordinate system; and
(i4) constructing the second coordinate system using the normal vector of the first axis, the normal vector of the second axis, and the origin.

6. The method as described in claim 5, wherein block (i1) comprises:
   (i11) receiving a first feature element of the to-be-moved object;
   (i12) determining if the first feature element is a plane;
   (i13) returning to block (i11) upon the condition that the first feature element is not a plane, or obtaining a normal vector of the first feature element upon the condition that the first feature element is a plane, wherein the normal vector of the first feature element is the normal vector of the first axis of the second coordinate system.

7. The method as described in claim 6, wherein block (i2) comprises:
   (i21) receiving a second feature element of the to-be-moved object;
   (i22) determining that if the second feature element is a plane;
   (i23) moving to block (i25) upon the condition that the second feature element is a plane, or determining that if the second feature element is a line upon the condition that the second feature element is not a plane;
   (i24) moving to block (i25) upon the condition that the second feature element is a line, or returning to block (i21) upon the condition that the second feature element is not a line;
   (i25) obtaining a normal vector of the second feature element;
   (i26) determining that if the normal vector of the second feature element is parallel to the normal vector of the first axis of the second coordinate system;
   (i27) returning to block (i21) upon the condition that the normal vector of the second feature element is parallel to the normal vector of the first axis of the second coordinate system; or
   (i28) projecting the normal vector of the second feature element to a plane which is perpendicular to the normal vector of the first axis of the second coordinate system for obtaining a projection normal vector upon the condition that the normal vector of the second feature element is not parallel to the normal vector of the first axis of the second coordinate system, wherein the projection normal vector is the normal vector of the second axis of the second coordinate system.

8. The method as described in claim 7, wherein block (i3) comprises:
   (i31) receiving a third feature element of the to-be-moved object;
   (i32) determining that if the third feature element is a plane
   (i33) obtaining a center of the third feature element upon the condition that the third feature element is not a plane, then moving to block (i38);
   (i34) determining that if the second feature element is a plane upon the condition that the third feature element is a plane, and returning to block (i31) upon the condition that the second feature element is not a plane;
   (i35) computing an intersection line of the first feature element and the second feature element upon the condition that the second feature element is a plane;
   (i36) determining that if the third feature element intersects with the intersection line, and returning to block (i31) upon the condition that the third feature element does not intersect with the intersection line;
   (i37) obtaining an intersection point of the third feature element and the intersection line upon the condition that the third feature element intersects with the intersection line; and
   (i38) obtaining the origin of the second coordinate system, wherein the origin of the second coordinate system is the intersection point or the center of the third feature element.

9. The method as described in claim 1, wherein block (e) comprises:
   computing a coordinate value (Oxref, Oyref, Ozref) of the origin Oref (0,0,0) of the first coordinate system using the third coordinate system;
   computing a coordinate value (Xxref, Xyref, Xzref) of a point Xref (1,0,0) of the X axis of the first coordinate system using the third coordinate system;
   computing a coordinate value (Yxref, Yyref, Yzref) of a point Yref (0,1,0) of the Y axis of the first coordinate system using the third coordinate system;
   computing a coordinate value (Zxref, Zyref, Zzref) of a point Zref (0,0,1) of the Z axis of the first coordinate system using the third coordinate system;
   obtaining a referenced matrix using the coordinate value (Oxref, Oyref, Ozref), the coordinate value (Xxref, Xyref, Xzref), the coordinate value (Yxref, Yyref, Yzref), the coordinate value (Zxref, Zyref, Zzref);
   computing a coordinate value (Oxmov, Oymov, Ozmov) of the origin Omov (0,0,0) of the second coordinate system using the third coordinate system;
   computing a coordinate value (Xxmov, Xymov, Xzmov) of a point Xmov (1,0,0) of the X axis of the second coordinate system using the third coordinate system;
   computing a coordinate value (Yxmov, Yymov, Yzmov) of a point Ymov (0,1,0) of the Y axis of the second coordinate system using the third coordinate system;
   computing a coordinate value (Zxmov, Zymov, Zzmov) of a point Zmov (0,0,1) of the Z axis of the second coordinate system using the third coordinate system;
   obtaining a moving matrix using the coordinate value (Oxmov, Oymov, Ozmov), the coordinate value (Xxmov, Xymov, Xzmov), the coordinate value (Yxmov, Yymov, Yzmov), and the coordinate value (Zxmov, Zymov, Zzmov); and
   obtaining the operation matrix by multiplying the reference matrix with the moving matrix.

10. A non-transitory storage medium having stored thereon instructions that, when executed by a processor, causing the processor to perform a method for aligning objects, wherein the method comprises:
   (a) receiving two objects comprising a reference object and a to-be-moved object;
   (b) receiving a plurality of feature elements of the reference object, and constructing a first coordinate system by determining a first axis, a second axis, and an origin of the first coordinate system according to the feature elements of the reference object;
   (c) receiving a plurality of feature elements of the to-be-moved object, and constructing a second coordinate system by determining a first axis, a second axis, and an origin of the second coordinate system according to the feature elements of the to-be-moved object;
   (d) constructing a third coordinate system by:
   determining an origin of the third coordinate system by obtaining an intersection point of the X axis of the first coordinate system and the Y axis of the second coordinate system;

determining an X axis of the third coordinate system by obtaining a normal vector of the X axis of the first coordinate system;

determining a Y axis of the third coordinate system by obtaining a normal vector of the Y axis of the second coordinate system; and constructing the third coordinate system;

(e) obtaining an operation matrix according to coordinate values of points on origin and axes of the first coordinate system and the second coordinate system, wherein the coordinate values are computed using the third coordinate system; and (f) moving each point of the to-be-measured object through multiplying coordinate values of each point of the to-be-moved object by the operation matrix, so as to align the reference object and the to-be-moved object.

11. The storage medium as described in claim 10, wherein each of the two objects is a point cloud or a three-dimension graphic.

12. The storage medium as described in claim 10, wherein each of the feature elements is selected from a group consisting of a line, a plane, a circle, and a sphere.

13. The storage medium as described in claim 10, wherein block (b) comprises:
- (i1) obtaining a normal vector of a first axis of the first coordinate system;
- (i2) obtaining a normal vector of a second axis of the first coordinate system;
- (i3) obtaining an origin of the first coordinate system; and
- (i4) constructing the first coordinate system using the normal vector of the first axis, the normal vector of the second axis, and the origin.

14. The storage medium as described in claim 13, wherein block (i1) comprises:
- (i11) receiving a first feature element of the reference object;
- (i12) determining if the first feature element is a plane;
- (i13) returning to block (i11) upon the condition that the first feature element is not a plane, or obtaining a normal vector of the first feature element upon the condition that the first feature element is a plane, wherein the normal vector of the first feature element is the normal vector of the first axis of the first coordinate system.

15. The storage medium as described in claim 14, wherein block (i2) comprises:
- (i21) receiving a second feature element of the reference object;
- (i22) determining that if the second feature element is a plane;
- (i23) moving to block (i25) upon the condition that the second feature element is a plane, or determining that if the second feature element is a line upon the condition that the second feature element is not a plane;
- (i24) moving to block (i25) upon the condition that the second feature element is a line, or returning to block (i21) upon the condition that the second feature element is not a line;
- (i25) obtaining a normal vector of the second feature element;
- (i26) determining that if the normal vector of the second feature element is parallel to the normal vector of the first axis of the first coordinate system;
- (i27) returning to block (i21) upon the condition that the normal vector of the second feature element is parallel to the normal vector of the first axis of the first coordinate system; or
- (i28) projecting the normal vector of the second feature element to a plane which is perpendicular to the normal vector of the first axis of the first coordinate system for obtaining a projection normal vector upon the condition that the normal vector of the second feature element is not parallel to the normal vector of the first axis of the first coordinate system, wherein the projection normal vector is the normal vector of the second axis of the first coordinate system.

16. The storage medium as described in claim 15, wherein block (i3) comprises:
- (i31) receiving a third feature element of the reference object;
- (i32) determining that if the third feature element is a plane
- (i33) obtaining a center of the third feature element upon the condition that the third feature element is not a plane, then moving to block (i38);
- (i34) determining that if the second feature element is a plane upon the condition that the third feature element is a plane, and returning to block (i31) upon the condition that the second feature element is not a plane;
- (i35) computing an intersection line of the first feature element and the second feature element upon the condition that the second feature element is a plane;
- (i36) determining that if the third feature element intersects with the intersection line, and returning to block (i31) upon the condition that the third feature element does not intersect with the intersection line;
- (i37) obtaining an intersection point of the third feature element and the intersection line upon the condition that the third feature element intersects with the intersection line; and
- (i38) obtaining the origin of the first coordinate system, wherein the origin of the first coordinate system is the intersection point or the center of the third feature element.

17. The storage medium as described in claim 10, wherein block (c) comprises:
- (e1) obtaining a normal vector of a first axis of the second coordinate system;
- (e2) obtaining a normal vector of a second axis of the second coordinate system;
- (e3) obtaining an origin of the second coordinate system; and
- (e4) constructing the second coordinate system using the normal vector of the first axis, the normal vector of the second axis, and the origin.

18. The storage medium as described in claim 10, wherein block (e) comprises:
computing a coordinate value (Oxref, Oyref, Ozref) of the origin Oref (0,0,0) of the first coordinate system using the third coordinate system;
computing a coordinate value (Xxref, Xyref, Xzref) of a point Xref (1,0,0) of the X axis of the first coordinate system using the third coordinate system;
computing a coordinate value (Yxref, Yyref, Yzref) of a point Yref (0,1,0) of the Y axis of the first coordinate system using the third coordinate system;
computing a coordinate value (Zxref, Zyref, Zzref) of a point Zref (0,0,1) of the Z axis of the first coordinate system using the third coordinate system;
obtaining a referenced matrix using the coordinate value (Oxref, Oyref, Ozref), the coordinate value (Xxref, Xyref, Xzref), the coordinate value (Yxref, Yyref, Yzref), the coordinate value (Zxref, Zyref, Zzref);
computing a coordinate value (Oxmov, Oymov, Ozmov) of the origin Omov (0,0,0) of the second coordinate system using the third coordinate system;

computing a coordinate value (Xxmov, Xymov, Xzmov) of a point Xmov (1,0,0) of the X axis of the second coordinate system using the third coordinate system;

computing a coordinate value (Yxmov, Yymov, Yzmov) of a point Ymov (0,1,0) of the Y axis of the second coordinate system using the third coordinate system;

computing a coordinate value (Zxmov, Zymov, Zzmov) of a point Zmov (0,0,1) of the Z axis of the second coordinate system using the third coordinate system;

obtaining a moving matrix using the coordinate value (Oxmov, Oymov, Ozmov), the coordinate value (Xxmov, Xymov, Xzmov), the coordinate value (Yxmov, Yymov, Yzmov), and the coordinate value (Zxmov, Zymov, Zzmov); and obtaining the operation matrix by multiplying the reference matrix with the moving matrix.

\* \* \* \* \*